United States Patent
Liao et al.

(10) Patent No.: US 9,685,588 B2
(45) Date of Patent: Jun. 20, 2017

(54) LIGHT-EMITTING ELEMENT HAVING A REFLECTIVE STRUCTURE WITH HIGH EFFICIENCY

(71) Applicant: EPISTAR CORPORATION, Hsinchu (TW)

(72) Inventors: Wen-Luh Liao, Hsinchu (TW); Shao-Ping Lu, Hsinchu (TW); Hung-Ta Cheng, Hsinchu (TW); Shih-I Chen, Hsinchu (TW); Chia-Liang Hsu, Hsinchu (TW); Shou-Chin Wei, Hsinchu (TW); Ching-Pei Lin, Hsinchu (TW); Yu-Ren Peng, Hsinchu (TW); Chien-Fu Huang, Hsinchu (TW); Wei-Yu Chen, Hsinchu (TW); Chun-Hsien Chang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 15/083,743

(22) Filed: Mar. 29, 2016

(65) Prior Publication Data
US 2016/0211414 A1    Jul. 21, 2016

Related U.S. Application Data

(63) Continuation of application No. 14/286,685, filed on May 23, 2014, now Pat. No. 9,331,247.

(30) Foreign Application Priority Data

May 24, 2013    (TW) .............................. 102118593 A

(51) Int. Cl.
| | |
|---|---|
| H01L 33/00 | (2010.01) |
| H01L 33/22 | (2010.01) |
| H01L 33/42 | (2010.01) |
| H01L 33/40 | (2010.01) |
| H01L 33/30 | (2010.01) |
| H01L 33/46 | (2010.01) |

(52) U.S. Cl.
CPC .............. *H01L 33/22* (2013.01); *H01L 33/30* (2013.01); *H01L 33/405* (2013.01); *H01L 33/42* (2013.01); *H01L 33/46* (2013.01); *H01L 2933/0091* (2013.01)

(58) Field of Classification Search
CPC ......... H01L 33/24; H01L 33/42; H01L 33/58; H01L 33/60; H01L 2224/48091
See application file for complete search history.

(56) References Cited

U.S. PATENT DOCUMENTS

2006/0204865 A1* 9/2006 Erchak .................... H01L 33/20
                                                                   430/7
2012/0126272 A1 5/2012 Kurata et al.
2012/0273753 A1 11/2012 Tanaka

* cited by examiner

*Primary Examiner* — Hoa B Trinh
(74) *Attorney, Agent, or Firm* — Muncy, Geissler, Olds & Lowe, P.C.

(57) ABSTRACT

An optoelectronic element comprises a semiconductor stack comprising an active layer, wherein the semiconductor stack has a first surface and a second surface opposite to the first surface; a first transparent layer on the second surface; a plurality of cavities in the first transparent layer; and a layer on the first transparent layer, wherein the first transparent layer comprises oxide or diamond-like carbon.

18 Claims, 4 Drawing Sheets

LIGHT-EMITTING ELEMENT HAVING A REFLECTIVE STRUCTURE WITH HIGH EFFICIENCY

REFERENCE TO RELATED APPLICATION

This application is a continuation application of U.S. patent application Ser. No. 14/286,685, filed on May, 23, 2014, which claims the right of priority based on TW application Serial No. 102118593, filed on May 24, 2013, and the content of which is hereby incorporated by reference in its entirety.

TECHNICAL FIELD

The application relates to a light emitting element, and more particularly to a light emitting element having a reflective structure with high efficiency.

DESCRIPTION OF BACKGROUND ART

An optoelectronic element, such as a light-emitting diode (LED), has been applied widely to optical display devices, traffic signals, data storing devices, communication devices, illumination devices, and medical apparatuses. Besides, the LED can be connected with other elements to form a light-emitting apparatus. FIG. 1 illustrates a schematic view of a conventional light-emitting apparatus. As shown in FIG. 1, a conventional light-emitting apparatus 1 includes a submount 12 with a circuit 14; a solder 16 on the submount 12, wherein an LED 11 is adhesively fixed on the submount 12 by the solder 16; and an electrical connecting structure 18 is electrically connecting the electrode 15 and the circuit 14 on the submount 12. Wherein, the submount 12 can be a lead frame or a mounting substrate.

SUMMARY OF THE DISCLOSURE

An optoelectronic element comprises a semiconductor stack comprising an active layer, wherein the semiconductor stack has a first surface and a second surface opposite to the first surface; a first transparent layer on the second surface; a plurality of cavities in the first transparent layer; and a layer on the first transparent layer, wherein the first transparent layer comprises oxide or diamond-like carbon.

DETAILED DESCRIPTION OF PREFERRED EMBODIMENTS

Figure 1:
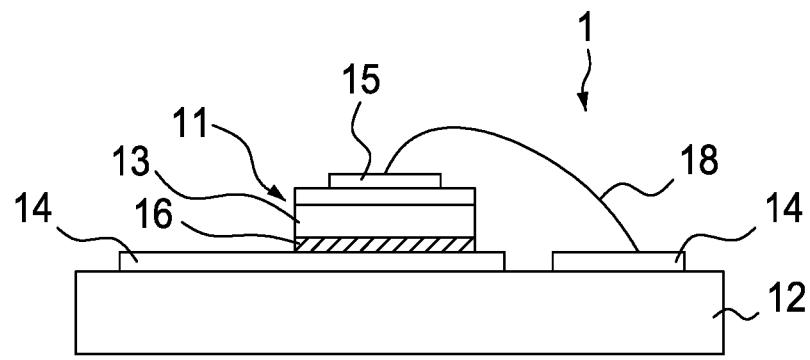
FIG. 1 shows an illustration of a conventional light-emitting apparatus.

The embodiments of the present application are described in detail and presented in the drawings. The same or similar parts are indicated with the same numbers in the drawings and the specification.

Figure 2:
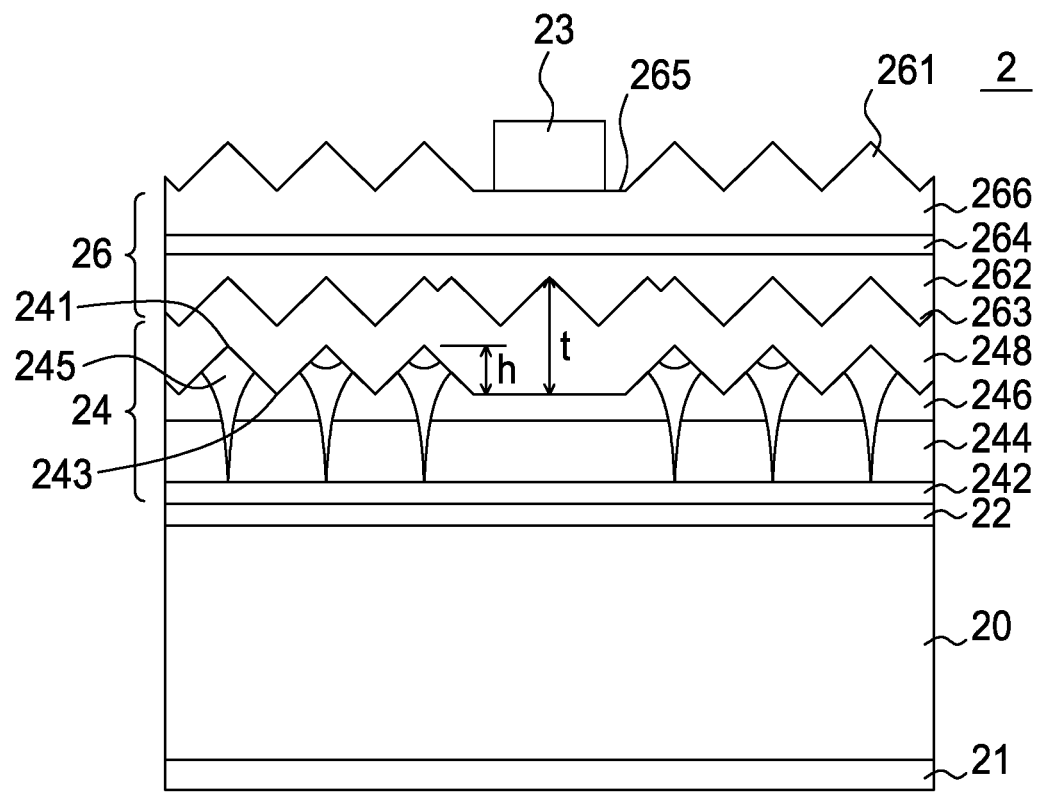
FIG. 2 shows an illustration of a cross section of a light-emitting element in accordance with one embodiment of the present application.

FIG. 2 shows a cross section of a light-emitting element in accordance with one embodiment of the present application. As shown in FIG. 2, the light-emitting element 2 includes a substrate 20, an adhesive layer 22 being disposed on the substrate 20, a reflective structure 24 being disposed on the adhesive layer 22, a light-emitting stack 26 being disposed on the reflective structure 24, a first electrode 21 being disposed under the substrate 20, and a second electrode 23 being disposed on the light-emitting stack 26. The light-emitting stack 26 includes a first semiconductor layer 262 being disposed on the reflective structure 24, an active layer 264 being disposed on the first semiconductor layer 262, and a second semiconductor layer 266 being disposed on the active layer 264.

The first electrode 21 and/or the second electrode 23 can receive the external voltage and can be composed of the transparent conductive material or the metal material. The transparent conductive material includes but is not limited to Indium-Tin Oxide (ITO), Indium Oxide (InO), Tin Oxide (SnO), Cadmium Tin Oxide (CTO), Antimony Tin Oxide (ATO), Aluminum Zinc Oxide (AZO), Zinc Tin Oxide (ZTO), Gallium Zinc Oxide (GZO), Zinc Oxide (ZnO), Gallium Phosphide (GaP), Indium Zinc Oxide (IZO), Diamond-like Carbon (DLC), Indium Gallium Oxide (IGO), Gallium Aluminum Zinc Oxide (GAZO), or the combination thereof. The metal material includes but is not limited to Aluminum (Al), Chromium (Cr), Copper (Cu), Tin (Sn), Gold (Au), Nickel (Ni), Titanium (Ti), Platinum (Pt), Lead (Pb), Zinc (Zn), Cadmium (Cd), Antimony (Sb), Cobalt (Co), or the alloy thereof.

The light-emitting stack 26 includes a rough upper surface 261 and a rough lower surface 263 to reduce the probability of internal total reflection and to enhance the light extraction efficiency. The rough upper surface includes a flat portion 265 which the second electrode 23 could be disposed thereon to enhance the adhesion between the second electrode 23 and the light-emitting stack 26 and to reduce the probability the second electrode 23 peeling off from the light-emitting stack 26 due to the sequential manufacturing processes such as wire bonding. The material of the light-emitting stack 26 could be a semiconductor material including more than one element such as Gallium (Ga), Aluminum (Al), Indium (In), Phosphorous (P), Nitrogen (N), Zinc (Zn), Cadmium (Cd), and Selenium (Se). The first semiconductor layer 262 and the second semiconductor layer 266 have different polarities and are used to produce electrons and holes. The active layer 264 can emit one single color or multiple colors, and the color(s) can be visible or invisible. The structure of the active can be a hetero-structure, a double hetero-structure, a double-sided double hetero-structure, a multi-layered multi-quantum-well structure, or a quantum-dot structure.

The reflective structure 24, along the direction from the adhesive layer 22 toward the light-emitting stack 26, includes a reflective layer 242, a first transparent layer 244, and a window layer 248. Optionally, a second transparent layer 246 can be formed additionally. In one embodiment, only the first transparent layer 244 is presented. In such embodiment, the window layer 248 includes a rough lower surface, and the rouge lower surface includes a plurality of protruding portions 241 and concave portions 243. Wherein, the rough lower surface further includes a flat portion located right under the second electrode 23 being used to form an ohmic contact with the first transparent layer 244. At least one cavity 245 is formed in the first transparent layer 244 and the cavity 245 can be extended from rough lower surface of the window layer 248 downward to the reflective layer 242. In another embodiment, the cavity 245 can be extended from the protruding portion 241 downward to the reflective layer 242. Wherein, the refractive index of the cavity 245 is smaller than the refractive indices of the window layer 248 and the first transparent layer 244. Because the refractive index of the cavity 245 is smaller than the refractive indices of the window layer 248 and the first transparent layer 244, the critical angle at the interface between the window layer 248 and the cavity 245 is smaller than the critical angle at the interface between the window layer 248 and the first transparent layer 244. After the light which is emitted from the light-emitting stack 26 emitting toward the cavity 245, the probability of the total reflection occurred at the interface between the window layer 248 and the cavity 245 increases. Besides, if the light at the interface between the window layer 248 and the cavity 245 not forming a total reflection and entering the first transparent layer 244, the total reflection is also occurred at the interface between the first transparent layer 244 and the cavity 245 and therefore to enhance the light extraction efficiency of the light-emitting element 2. Taking a view of the cross section, the cavity 245 is in the shape of a funnel with a wide upper part and a narrow lower part.

In another embodiment, the reflective structure 24 can further include a second transparent layer 246 located between part of the first transparent layer 244 and the window layer 248 to enhance the adhesion and the spreading of the current between the first transparent layer 244 and the window layer 248. In another embodiment, the second transparent layer 246 can include a cavity 245, and wherein the refractive index of the cavity 245 is smaller than the refractive indices of the window layer 248 and the second transparent layer 246. Because the refractive index of the cavity 245 is smaller than the refractive indices of the window layer 248 and the second transparent layer 246, the critical angle at the surface between the second transparent layer 246 and the cavity 245 is smaller than the critical angle at the surface between the window layer 248 and the second transparent layer 246. After the light which is emitted from the light-emitting stack 26 emitting toward the cavity 245, the probability of the total reflection occurred at the interface between the second transparent layer 246 and the cavity 245 increases. In another embodiment, the reflective structure 24 does not have the window layer 248, and the first transparent layer 244 is formed under the light-emitting stack 26. In the embodiment, the rough lower surface 263 of the light-emitting stack 26 includes a plurality of protruding portions and concave portions and therefore is favorable of forming the cavity 245.

The window layer 248 is transparent to the light emitted by the light-emitting stack 26 and is used to enhance the light extraction efficiency. The material of the window layer can be a conductive material, which includes but is not limited to Indium-Tin Oxide (ITO), Indium Oxide (InO), Tin Oxide (SnO), Cadmium Tin Oxide (CTO), Antimony Tin Oxide (ATO), Aluminum Zinc Oxide (AZO), Zinc Tin Oxide (ZTO), Gallium Zinc Oxide (GZO), Zinc Oxide (ZnO), Gallium Phosphide (GaP), Indium Zinc Oxide (IZO), Diamond-like Carbon (DLC), Indium Gallium Oxide (IGO), Gallium Aluminum Zinc Oxide (GAZO), or the combination thereof. The height difference h between the concave portion 243 and the protruding portion 241 of the rough lower surface is about ⅓ to ⅔ the thickness of the window layer and is favorable of forming the cavity 245.

The materials of the first transparent layer 244 and/or the second transparent layer 246 are transparent to the light emitted by the light-emitting stack 26 and is used to increase the adhesion and the spreading of the current between the window layer 248 and the reflective layer 242. Besides, the materials of the first transparent layer 244 and/or the second transparent layer 246 can form an Omni-Directional Reflector (ODR) with the reflective layer 242. The material of the first transparent layer 244 and/or the second transparent layer 246 can be a transparent conductive material which includes but is not limited to Indium-Tin Oxide (ITO), Indium Oxide (InO), Tin Oxide (SnO), Cadmium Tin Oxide (CTO), Antimony Tin Oxide (ATO), Aluminum Zinc Oxide (AZO), Zinc Tin Oxide (ZTO), Gallium Zinc Oxide (GZO), Zinc Oxide (ZnO), Gallium Phosphide (GaP), Indium Zinc Oxide (IZO), Diamond-like Carbon (DLC), Indium Gallium Oxide (IGO), Gallium Aluminum Zinc Oxide (GAZO), or the combination thereof. The method of forming the first transparent layer 244 and/or the second transparent layer 246 includes the physical vapour deposition method, such as E-beam deposition or sputtering. The reflective layer 242 can reflect the light from the light-emitting stack 26 and the material can be a metal material, which includes but is not limited to Copper (Cu), Aluminum (Al), Tin (Sn), Gold (Au), Silver (Ag), Lead (Pb), Titanium (Ti), Nickel (Ni), Platinum (Pt), Tungsten (W), or the alloy thereof.

The adhesive layer 22 can connect the substrate 20 and the reflective structure 24 and can include a plurality of sublayers (not shown). The material of the adhesive layer 22 can be a transparent conductive material or a metal material, the transparent conductive material includes but is not limited to Indium-Tin Oxide (ITO), Indium Oxide (InO), Tin Oxide (SnO), Cadmium Tin Oxide (CTO), Antimony Tin Oxide (ATO), Aluminum Zinc Oxide (AZO), Zinc Tin Oxide (ZTO), Gallium Zinc Oxide (GZO), Zinc Oxide (ZnO), Gallium Phosphide (GaP), Indium Cerium Oxide (ICO), Indium Tungsten Oxide (IWO), Indium Titanium Oxide (ITiO), Indium Zinc Oxide (IZO), Indium Gallium Oxide (IGO), Gallium Aluminum Zinc Oxide (GAZO), or the combination thereof. The metal material includes but is not limited to Copper (Cu), Aluminum (Al), Tin (Sn), Gold (Au), Silver (Ag), Lead (Pb), Titanium (Ti), Nickel (Ni), Platinum (Pt), Tungsten (W), or the alloy thereof.

The substrate 20 can be used to support the light-emitting stack 26 thereon and other layers or structures, and its material can be a transparent material or a conductive material. The transparent material can include but is not limited to Sapphire, Diamond, Glass, Epoxy, Quartz, Acryl, Aluminum Oxide ($Al_2O_3$), Zinc Oxide (ZnO), or Aluminum Nitride (AlN) and so on. The conductive material can include but is not limited to Copper (Cu), Aluminum (Al), Molybdenum (Mo), Tin (Sn), Zinc (Zn), Cadmium (Cd), Nickel (Ni), Cobalt (Co), Diamond Like Carbon (DLC), Graphite, Carbon fiber, Metal Matrix Composite (MMC), Ceramic Matrix Composite (CMC), Silicon (Si), Zinc Selenium (ZnSe), Gallium Arsenide (GaAs), Silicon Carbide (SiC), Gallium Phosphide (GaP), Gallium Arsenic Phosphide (GaAsP), Lithium Gallium Oxide ($LiGaO_2$), or Lithium Aluminum Oxide ($LiAlO_2$).

Figure 3:
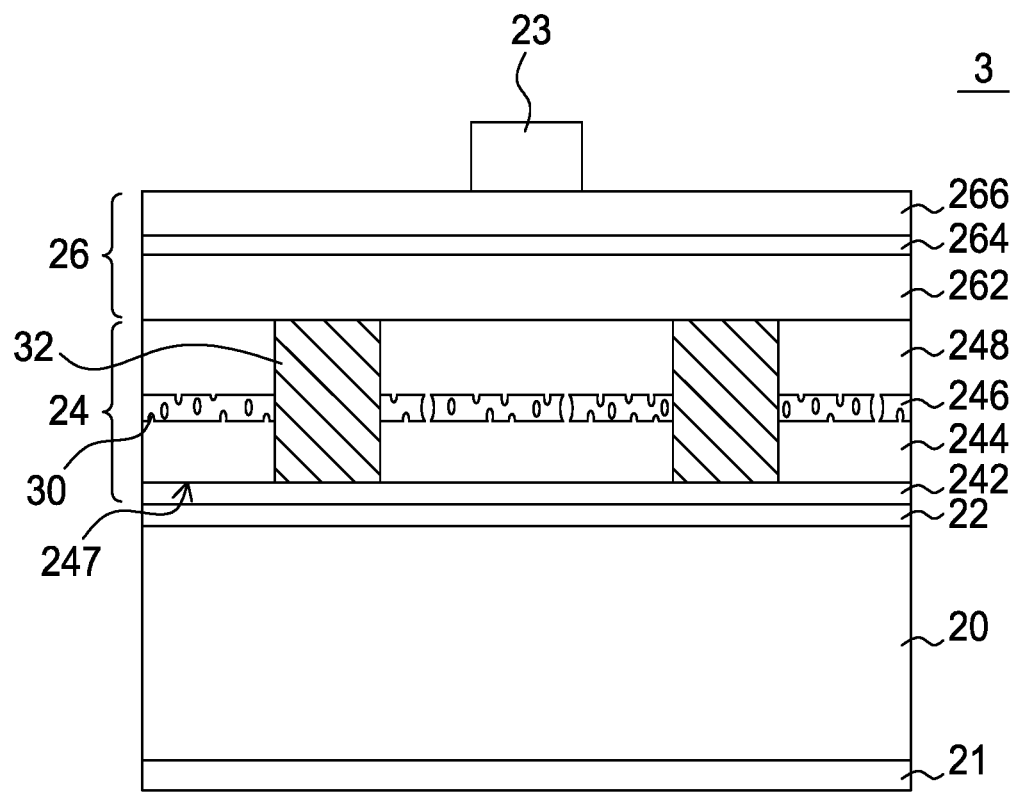
FIG. 3 shows an illustration of a cross section of a light-emitting element in accordance with another embodiment of the present application.
Figure 4:
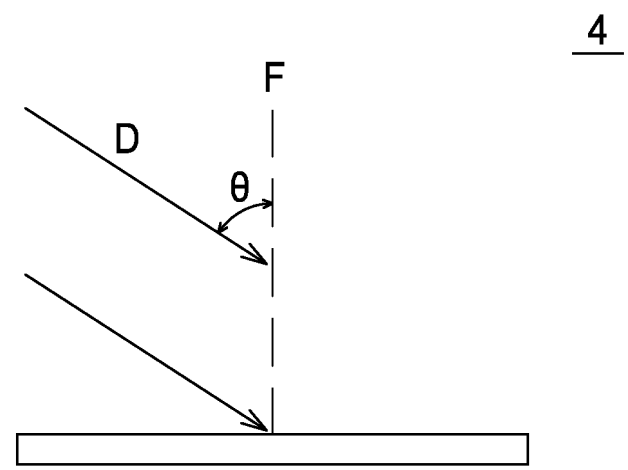
FIG. 4 shows an illustration of the deposition direction of the second transparent layer in accordance with the embodiment shown in FIG. 3.

FIG. 3 discloses a cross section of a light-emitting element in accordance of another embodiment of the present application. A light-emitting element 3 includes a similar structure to the aforementioned light-emitting element 2, but the second transparent layer 246 of the reflective structure 24 includes a plurality of cavities 30 so that the refractive index of the second transparent layer 246 is smaller than 1.4, and is preferred to be 1.35. As shown in FIG. 4, the cavities 30 are formed by fixing the wafer 4 to a specific direction, such as the direction D which has an included angle θ with the normal perpendicular to the wafer, to deposit the material of the second transparent layer 246 onto the wafer by the physical vapour deposition method. Because of the adjustment of the deposition direction D, there are some areas that the material is not deposited onto and the cavities are formed. Wherein, the included angle is about 60 degrees. The refractive index of the second transparent layer 246 with cavities 30 is smaller than the transparent layer without the cavities, the probability of the total reflection occurred at the interface between the second transparent layer 246 and another layer can be increased, and therefore the light extraction efficiency of the light-emitting element 3 is enhanced. The first transparent layer 244 can be formed by the physical vapour deposition method or the chemical vapour deposition method under the second transparent layer 246 and has a thickness larger than that of the second transparent layer 246 so that it can prevent the material of the reflective layer 242 from diffusing into the cavities and destroying the structure of the reflective layer 242 and decrease the reflectivity of the reflective layer 242. The first transparent layer 244 includes a lower surface 247, which can be polished by the chemical mechanical polishing method (CMP) to make it has an average roughness of the center line (Ra) about 1 nm~40 nm. When the reflective layer 242 is formed under the first lower surface 247, the reflective layer 242 can form a surface with a lower average roughness of the center line (Ra) and therefore increase the reflectivity of the reflective layer 242.

The light-emitting element 3 further includes a conductive portion 32 located between the light-emitting stack 26 and the reflective layer 242. In another embodiment, the conductive portion 32 can be located between the window layer 248 and the reflective layer 242. The conductive portion 32 can conduct the current. The material of the conductive portion can be a transparent conductive material or a metal material. The transparent conductive material can be but is not limited to Indium-Tin Oxide (ITO), Indium Oxide (InO), Tin Oxide (SnO), Cadmium Tin Oxide (CTO), Antimony Tin Oxide (ATO), Aluminum Zinc Oxide (AZO), Zinc Tin Oxide (ZTO), Gallium Zinc Oxide (GZO), Zinc Oxide (ZnO), Gallium Phosphide (GaP), Indium Cerium Oxide (ICO), Indium Tungsten Oxide (IWO), Indium Titanium Oxide (ITiO), Indium Zinc Oxide (IZO), Indium Gallium Oxide (IGO), Gallium Aluminum Zinc Oxide (GAZO), or the combination thereof. The metal material includes but is not limited to Copper (Cu), Aluminum (Al), Tin (Sn), Gold (Au), Silver (Ag), Lead (Pb), Titanium (Ti), Nickel (Ni), Platinum (Pt), Tungsten (W), Germanium (Ge), or the alloy thereof.

In this embodiment, the material of the first transparent layer 244 and/or the second transparent layer 246 can be an insulating material such as Polyimide (PI), Benzocyclobutene (BCB), Perfluorocyclobutane (PFCB), Magnesium oxide (MgO), SU8, Epoxy, Acrylic resin, Cycloalkenes Copolymer (COC), Poly(methyl methacrylate) (PMMA), Poly (ethylene terephthalate) (PET), Polycarbonate (PC), Polyetherimide, Fluorocarbon polymer, Glass, Aluminum Oxide ($Al_2O_3$), Silicon Oxide (SiOx), Titanium Oxide ($TiO_2$), Tantalic Oxide ($Ta_2O_5$), Silicon Nitride (SiNx), Magnesium Fluoride ($MgF_2$), Spin-on-glass (SOG), or Tetraethyl orthosilicate (TEOS).

Figure 5:
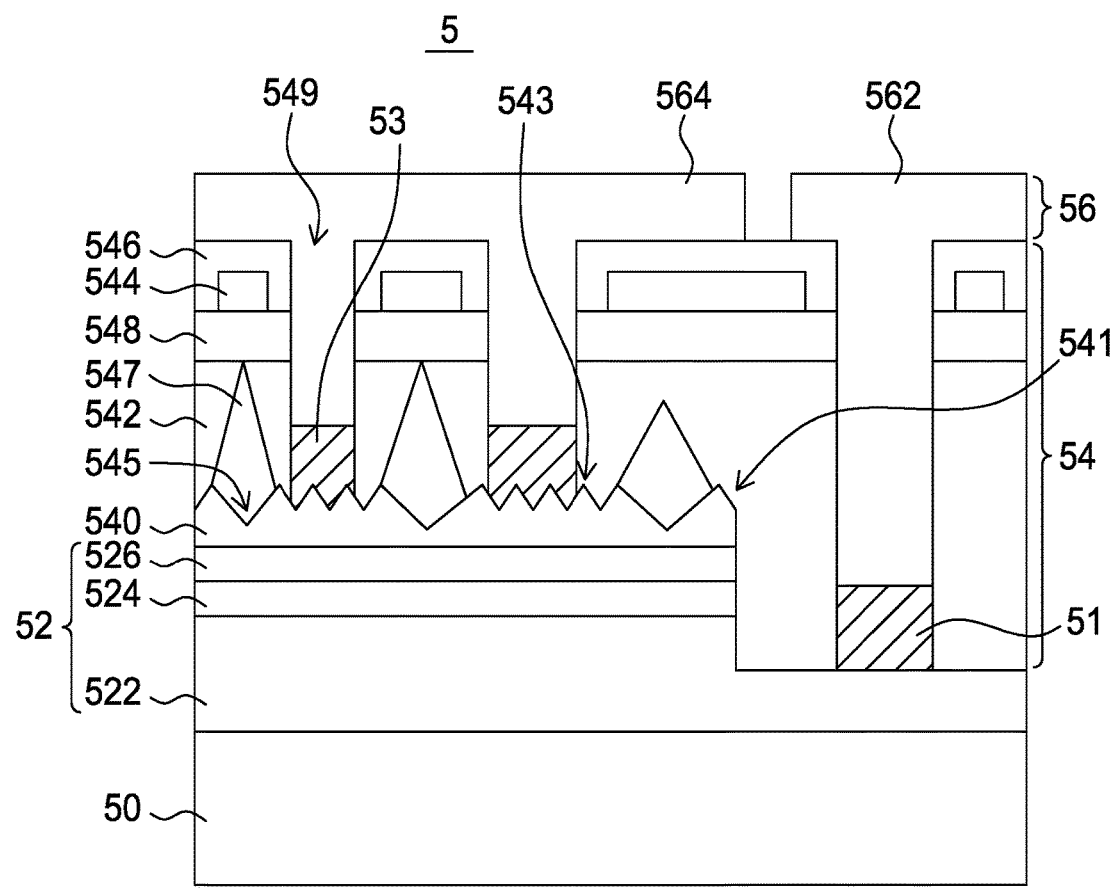
FIG. 5 shows an illustration of a cross section of a light-emitting element in accordance with another embodiment of the present application.

FIG. 5 discloses a cross section of a light-emitting element in accordance of another embodiment of the present application. As shown in FIG. 5, a light-emitting element 5 includes a substrate 50; a light-emitting stack 52 on the substrate 50; a reflective structure 54 on the light-emitting stack 52; and an electrode 56 on the reflective structure 54. The light-emitting stack 52 includes a first semiconductor layer 522 located on the substrate 50; an active layer 524 located on the first semiconductor layer 522; and a second semiconductor layer 526 located on the active layer 524. Wherein, a portion of the semiconductor layer 526 and the active layer 524 are removed in order to expose the first semiconductor layer 522.

The reflective structure 54 includes a window layer 540 located on the light-emitting stack 52; a first transparent layer 542 located on the window layer 540; a reflective layer 544 located on the first transparent layer 542; and a first insulating layer 546 located on the reflective layer 544. The window layer 540 includes a rouge upper surface 541, and the rouge upper surface includes a plurality of protruding portions 543 and concave portions 545. At least one cavity 547 is formed in the first transparent layer 542 and on the rough upper surface 541. The refractive index of the cavity 547 is smaller than the refractive indices of the window layer 540 and of the first transparent layer 542. In another embodiment, the cavities 547 can be extended upward from the concave portions 545. Because the refractive index of the cavities 547 is smaller than the refractive indices of the window layer 540 and the first transparent layer 542, the critical angle at the interface between the window layer 540 and the cavities 547 is smaller than the critical angle at the interface between the window layer 540 and the first transparent layer 542. After the light which is emitted from the light-emitting stack 52 emitting toward the cavity 547, the probability the total reflection occurred at the interface between the window layer 540 and the cavity 547 increases. Besides, the light not forming a total reflection at the interface between the window layer 540 and the first transparent layer 542 enters the first transparent layer 542 and the total reflection is occurred at the interface between the first transparent layer 542 and the cavity 547 and therefore to enhance the light extraction efficiency of the light-emitting element 5. Viewing from the cross section, the cavity 547 is in the shape of a funnel with a wide upper part and a narrow lower part. Because the probability of the total reflection occurred for the light emitted from the light-emitting stack 52 at the interface between the window layer 540 and the cavities 547 and at the interface between the first transparent layer 542 and the cavities 547 increases, the probability the light arrives to the electrode 56 and is absorbed by the electrode 56 is decreased, and the light extraction efficiency of the light-emitting element 5 is increased. The first insulating layer 546 can cover the reflective layer 544 so that the reflective layer 544 does not directly contact with the electrode 56 in order to prevent the material of the reflective layer 544 from diffusing to the electrode 56 and decreasing the reflectivity of the reflective layer 544. The reflective structure 54 further includes a plurality of channels 549 formed in the first transparent layer 542 and in the first insulating layer 546 so that the electrode 56 can electrically contact with the light-emitting stack 52 through the channels 549. The reflective structure 54 can further include a second transparent layer 548 located between part of the first transparent layer 542 and the reflective layer 544. The second transparent layer 548 does not include the cavities so that it can prevent the material of the reflective layer 544 from diffusing to the cavities and destroying the structure of the reflective structure 544, which degrades the reflectivity of the reflective layer 544.

The electrode 56 includes a first conductive layer 562 and a second conductive layer 564, and wherein the first conductive layer 562 and the second conductive layer 564 does not contact each other. The first conductive layer 562 connects the first semiconductor layer 522 through the channels 549, and the second conductive layer 564 connects the window layer 540 through the channels 549. In another embodiment, the light-emitting element 5 further includes a first contact layer 51 located between the first conductive layer 562 and the first semiconductor layer 522 in order to increase the adhesion between the first conductive layer 562 and the first semiconductor layer 522. The second contact layer 53 is located between the second conductive layer 564 and the window layer 540 in order to increase the adhesion between the second conductive layer 564 and the window layer 540, to decrease the operating voltage of the light-emitting element 5, and to increase the efficiency. Wherein, the materials of the first contact layer 51 and the second contact layer 52 is the same as the materials of the aforementioned electrodes.

Figure 6:
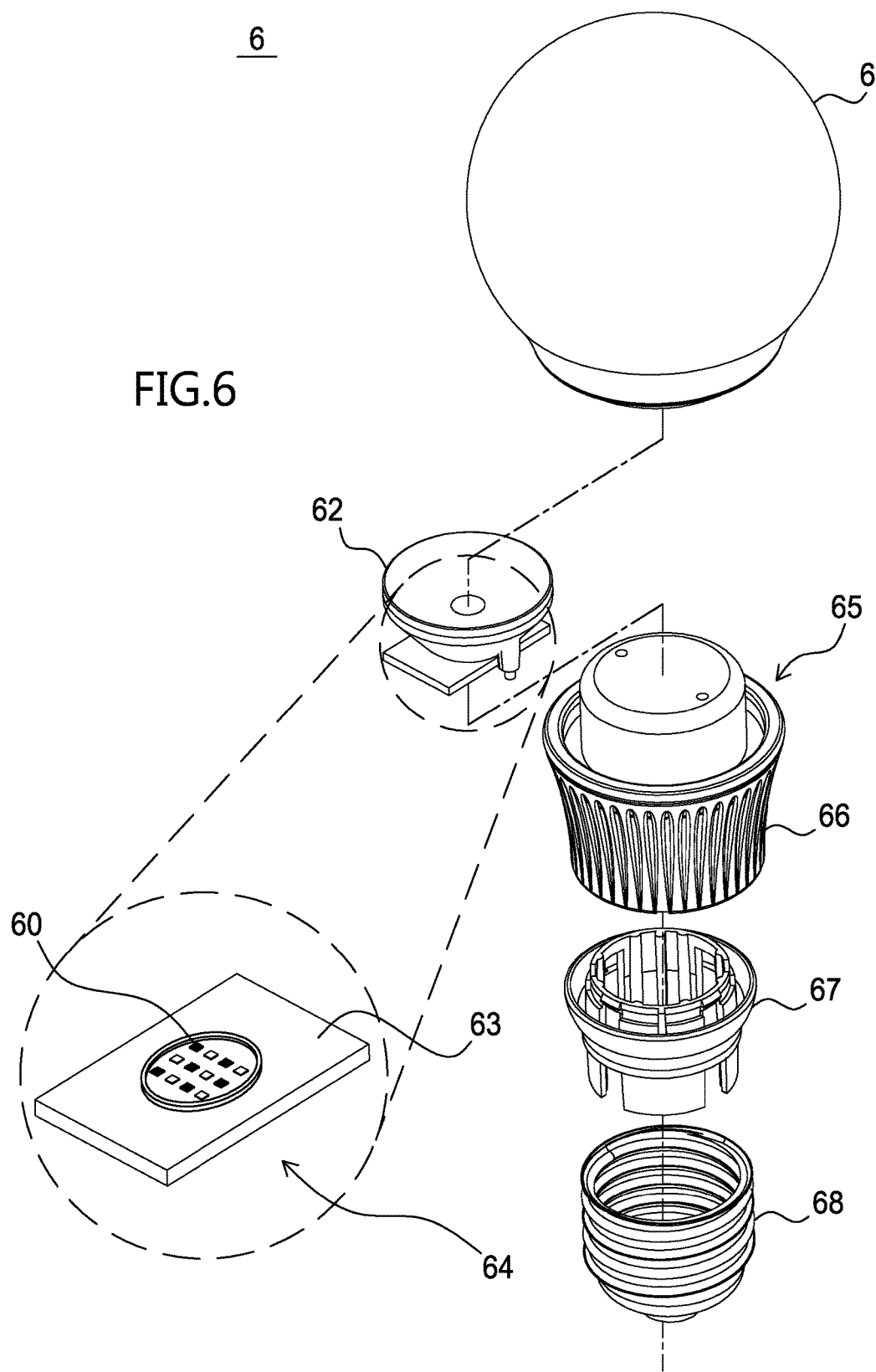
FIG. 6 shows an illustration of the explosion of a light bulb in accordance with one embodiment of the present application.

FIG. 6 discloses an illustration of the explosion of a light bulb. A light bulb 6 includes a globe 61, a lens 62 located in the globe 61, a light-emitting module 64 located under the lens 62, a lampstand 65 including a heat dissipation tank 66 used to support the light-emitting module 64, a connecting portion 67, and an electrical connecting apparatus 68. Wherein, the connecting portion 67 connects the lampstand 65 and the electrical connecting apparatus 68. The light-emitting module 66 includes a supporting body 63 and a plurality of the light-emitting elements 60 in accordance with any one of the aforementioned embodiment located on the supporting body 63.

Although the present application has been explained above, it is not the limitation of the range, the sequence in practice, the material in practice, or the method in practice. Any modification or decoration for present application is not detached from the spirit and the range of such.

What is claimed is:

1. An optoelectronic element, comprising:
   a semiconductor stack comprising an active layer, wherein the semiconductor stack has a first surface and a second surface opposite to the first surface;
   a first transparent layer on the second surface;
   a plurality of cavities in the first transparent layer; and
   a layer on the first transparent layer;
   wherein the first transparent layer comprises oxide or diamond-like carbon,
   wherein the second surface comprises a second rough portion and a second flat portion, and one of the cavities is on the second rough portion, and
   wherein the first surface comprises a first flat portion and a first rough portion, and the electrode is on the first flat portion.

2. The optoelectronic element according to claim 1, wherein the second flat portion and the first transparent layer form an ohmic contact.

3. The optoelectronic element according to claim 1, wherein a refractive index of the cavity is smaller than that of the first transparent layer and the semiconductor stack.

4. The optoelectronic element according to claim 1, wherein the layer comprises a surface facing the semiconductor stack, and the surface has an average roughness of the center line between 1 nm and 40 nm.

5. The optoelectronic element according to claim 1, further comprising a second transparent layer between the first transparent layer and the layer.

6. The optoelectronic element according to claim 5, wherein the second transparent layer has a thickness larger than that of the first transparent layer.

7. The optoelectronic element according to claim 1, wherein the layer comprises a material selected from Copper (Cu), Aluminum (Al), Gold (Au), Silver (Ag) or the alloy thereof.

8. The optoelectronic element according to claim 1, wherein the semiconductor stack comprises a window layer.

9. The optoelectronic element according to claim 8, wherein the window layer comprises GaP.

10. The optoelectronic element according to claim 1, further comprising a substrate on the layer, and an adhesive layer between the substrate and the layer for connecting thereof.

11. The optoelectronic element according to claim 1, wherein the first transparent layer comprises a plurality of channels.

12. An optoelectronic element, comprising:
    a semiconductor stack comprising an active layer, wherein the semiconductor stack has a first surface and a second surface opposite to the first surface;
    a first transparent layer on the second surface;
    a plurality of cavities in the first transparent layer;
    a layer on the first transparent layer;
    a first conductive layer on the layer; and
    a second conductive layer on the layer;
    wherein the first transparent layer comprises oxide or diamond-like carbon,
    wherein the first transparent layer comprises a plurality of channels, and
    wherein the first conductive layer and the second conductive layer are separated.

13. The optoelectronic element according to claim 12, wherein the first conductive layer electrically contacting with the semiconductor stack through the plurality of channels.

14. The optoelectronic element according to claim 12, wherein the layer comprises a reflective layer.

15. The optoelectronic element according to claim 14, further comprising a second transparent layer between the layer and the first conductive layer.

16. The optoelectronic element according to claim 1, wherein one of the cavities has an opening facing the second surface.

17. The optoelectronic element according to claim 1, wherein the layer covers one of the cavities.

18. An optoelectronic element, comprising:
    a semiconductor stack comprising an active layer, wherein the semiconductor stack has a first surface and a second surface opposite to the first surface;
    a first transparent layer on the second surface;
    a plurality of cavities in the first transparent layer;
    a layer on the first transparent layer; and
    an electrode on the first surface,
    wherein the first transparent layer comprises oxide or diamond-like carbon,
    wherein the second surface comprises a second rough portion and a second flat portion, and one of the cavities is on the second rough portion,
    wherein the second flat portion is right under the electrode.

* * * * *